(12) United States Patent
Yamaga

(10) Patent No.: US 8,418,028 B2
(45) Date of Patent: Apr. 9, 2013

(54) CHIEN SEARCH DEVICE AND CHIEN SEARCH METHOD

(75) Inventor: Akira Yamaga, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/812,982

(22) PCT Filed: Sep. 19, 2008

(86) PCT No.: PCT/JP2008/067577
§ 371 (c)(1),
(2), (4) Date: Jul. 15, 2010

(87) PCT Pub. No.: WO2009/110124
PCT Pub. Date: Sep. 11, 2009

(65) Prior Publication Data
US 2011/0047441 A1    Feb. 24, 2011

(30) Foreign Application Priority Data

Mar. 1, 2008 (JP) .................................. 2008-051462

(51) Int. Cl.
*G11C 29/00* (2006.01)
(52) U.S. Cl. ........................................ 714/763; 714/773
(58) Field of Classification Search .................. None
See application file for complete search history.

(56) References Cited

U.S. PATENT DOCUMENTS

| | | | |
|---|---|---|---|
| 4,706,249 A * | 11/1987 | Nakagawa et al. | ........... 714/773 |
| 5,027,357 A | 6/1991 | Yu et al. | |
| 5,684,810 A | 11/1997 | Nakamura et al. | |
| 5,712,861 A * | 1/1998 | Inoue et al. | ................... 714/752 |
| 6,048,090 A | 4/2000 | Zook | |
| 6,651,212 B1 * | 11/2003 | Katayama et al. | ............ 714/763 |
| 7,237,183 B2 * | 6/2007 | Xin | ................................ 714/782 |
| 7,711,889 B2 * | 5/2010 | Kudo et al. | ................... 711/103 |
| 2003/0046637 A1 | 3/2003 | Zhang | |
| 2003/0140303 A1 | 7/2003 | Litwin, Jr. et al. | |
| 2006/0107190 A1 | 5/2006 | Zhang | |

(Continued)

FOREIGN PATENT DOCUMENTS

| | | |
|---|---|---|
| CN | 1623280 A | 6/2005 |
| EP | 0 364 172 A2 | 4/1990 |

(Continued)

OTHER PUBLICATIONS

Yuejian Wu, "Low Power Decoding of BCH Codes", Circuits and Systems, 2004 IEEE, ISCAS 2004, XP010720182, vol. 2, May 23, 2004, pp. 369-372.

(Continued)

*Primary Examiner* — Guerrier Merant
(74) *Attorney, Agent, or Firm* — Oblon, Spivak, McClelland, Maier & Neustadt, L.L.P.

(57) ABSTRACT

To provide a Chien search device and a Chien search method capable of performing a Chien search process at a high speed. The Chien search device calculates an error position at the time of correcting an error included in data read from a nonvolatile memory, and includes a first processing unit that performs a search process of an error position in at least one-bit unit to an error-correction area of input data, and a second processing unit that processes at one time plural bits in an non-error-correction-target area of the input data.

15 Claims, 12 Drawing Sheets

U.S. PATENT DOCUMENTS

| | | | |
|---|---|---|---|
| 2008/0028131 A1* | 1/2008 | Kudo et al. | 711/103 |
| 2008/0301524 A1 | 12/2008 | Horisaki et al. | |
| 2009/0222708 A1 | 9/2009 | Yamaga | |

FOREIGN PATENT DOCUMENTS

| | | |
|---|---|---|
| EP | 1 470 647 A1 | 10/2004 |
| JP | 7 202717 | 8/1995 |
| JP | 2007 87464 | 4/2007 |
| WO | WO 03/063364 A1 | 7/2003 |

OTHER PUBLICATIONS

K. Seki, et al., "Single-Chip FEC Codec Using a Concatenated BCH Code for 10 Gb/s Long-Haul Optical Transmission Systems", IEEE 2003 Custom Integrated Circuits Conference, XP010671218, vol. CONF. 25, Sep. 21, 2003, pp. 279-282.

Supplementary Search Report issued Jun. 6, 2011 in European Patent Application No. 08873054.4-1247/2248264.

U.S. Appl. No. 13/238,685, filed Sep. 21, 2011, Nagadomi, et al.

Office Action issued Jul. 31, 2012, in Chinese Patent Application No. 200880127752.7, (with English-language Translation).

Office Action issued Nov. 7, 2012 in European Patent Application No. 08 873 054.4.

Hsie-Chia Chang, et al. "A Low-Power Reed-Solomon Decoder for STM-16 Optical Communications", ASIC, XP010602864, Aug. 6, 2002, pp. 351-354.

* cited by examiner

FIG. 9-1

CONFIGURATION DIAGRAM OF x$\alpha$ CIRCUIT b0 [0] = a0 [7]
b0 [1] = a0 [0]
b0 [2] = a0 [1] $\oplus$ a0 [7]
b0 [3] = a0 [2] $\oplus$ a0 [7]
b0 [4] = a0 [3] $\oplus$ a0 [7]
b0 [5] = a0 [4]
b0 [6] = a0 [5]
b0 [7] = a0 [6]

$\oplus$ REPRESENTS EXOR CALCULATION

FIG. 9-2

CONFIGURATION DIAGRAM OF x$\alpha$^32 CIRCUIT c0 [0] = a0 [0] $\oplus$ a0 [1] $\oplus$ a0 [4] $\oplus$ a0 [7]
c0 [1] = a0 [1] $\oplus$ a0 [2] $\oplus$ a0 [5] $\oplus$
c0 [2] = a0 [0] $\oplus$ a0 [1] $\oplus$ a0 [2] $\oplus$ a0 [3] $\oplus$ a0 [4] $\oplus$ a0 [6] $\oplus$ a0 [7]
c0 [3] = a0 [0] $\oplus$ a0 [2] $\oplus$ a0 [3] $\oplus$ a0 [5]
c0 [4] = a0 [0] $\oplus$ a0 [3] $\oplus$ a0 [6] $\oplus$ a0 [7]
c0 [5] = a0 [1] $\oplus$ a0 [4] $\oplus$ a0 [7]
c0 [6] = a0 [2] $\oplus$ a0 [5] $\oplus$
c0 [7] = a0 [0] $\oplus$ a0 [3] $\oplus$ a0 [6]

$\oplus$ REPRESENTS EXOR CALCULATION

FIG. 9-3

CONFIGURATION DIAGRAM OF x$\alpha$^111 CIRCUIT d0 [0] = a0 [1] $\oplus$ a0 [2] $\oplus$ a0 [6] $\oplus$ a0 [7]
d0 [1] = a0 [0] $\oplus$ a0 [2] $\oplus$ a0 [3] $\oplus$ a0 [7]
d0 [2] = a0 [0] $\oplus$ a0 [2] $\oplus$ a0 [3] $\oplus$ a0 [4] $\oplus$ a0 [6] $\oplus$ a0 [7]
d0 [3] = a0 [0] $\oplus$ a0 [2] $\oplus$ a0 [3] $\oplus$ a0 [4] $\oplus$ a0 [5] $\oplus$ a0 [6]
d0 [4] = a0 [2] $\oplus$ a0 [3] $\oplus$ a0 [4] $\oplus$ a0 [5]
d0 [5] = a0 [3] $\oplus$ a0 [4] $\oplus$ a0 [5] $\oplus$ a0 [6]
d0 [6] = a0 [0] $\oplus$ a0 [4] $\oplus$ a0 [5] $\oplus$ a0 [6] $\oplus$ a0 [7]
d0 [7] = a0 [0] $\oplus$ a0 [1] $\oplus$ a0 [5] $\oplus$ a0 [6] $\oplus$ a0 [7]

$\oplus$ REPRESENTS EXOR CALCULATION

FIG. 9-4

CONFIGURATION DIAGRAM OF x α^2 CIRCUIT b1 [0] = a1 [6]
b1 [1] = a1 [7]
b1 [2] = a1 [0] ⊕ a1 [6]
b1 [3] = a1 [1] ⊕ a1 [6] ⊕ a1 [7]
b1 [4] = a1 [2] ⊕ a1 [6] ⊕ a1 [7]
b1 [5] = a1 [3] ⊕ a1 [7]
b1 [6] = a1 [4]
b1 [7] = a1 [5]

⊕ REPRESENTS EXOR CALCULATION

FIG. 9-5

CONFIGURATION DIAGRAM OF x α^64 CIRCUIT c1 [0] = a1 [0] ⊕ a1 [2] ⊕ a1 [4] ⊕ a1 [5]
c1 [1] = a1 [0] ⊕ a1 [1] ⊕ a1 [3] ⊕ a1 [5] ⊕ a1 [6]
c1 [2] = a1 [0] ⊕ a1 [1] ⊕ a1 [5] ⊕ a1 [6] ⊕ a1 [7]
c1 [3] = a1 [0] ⊕ a1 [1] ⊕ a1 [4] ⊕ a1 [5] ⊕ a1 [6] ⊕ a1 [7]
c1 [4] = a1 [0] ⊕ a1 [1] ⊕ a1 [4] ⊕ a1 [6] ⊕ a1 [7]
c1 [5] = a1 [1] ⊕ a1 [2] ⊕ a1 [5] ⊕ a1 [7]
c1 [6] = a1 [0] ⊕ a1 [2] ⊕ a1 [3] ⊕ a1 [6]
c1 [7] = a1 [1] ⊕ a1 [3] ⊕ a1 [4] ⊕ a1 [7]

⊕ REPRESENTS EXOR CALCULATION

FIG. 9-6

CONFIGURATION DIAGRAM OF x α^222 CIRCUIT d1 [0] = a1 [1] ⊕ a1 [6]
d1 [1] = a1 [0] ⊕ a1 [2] ⊕ a1 [7]
d1 [2] = a1 [3] ⊕ a1 [6]
d1 [3] = a1 [0] ⊕ a1 [1] ⊕ a1 [4] ⊕ a1 [6] ⊕ a1 [7]
d1 [4] = a1 [2] ⊕ a1 [5] ⊕ a1 [6] ⊕ a1 [7]
d1 [5] = a1 [3] ⊕ a1 [6] ⊕ a1 [7]
d1 [6] = a1 [4] ⊕ a1 [7]
d1 [7] = a1 [0] ⊕ a1 [5]

⊕ REPRESENTS EXOR CALCULATION

CHIEN SEARCH DEVICE AND CHIEN SEARCH METHOD

TECHNICAL FIELD

The present invention relates to a Chien search device and a Chien search method, and, more particularly to a Chien search device and a Chien search method capable of making a Chien search to be performed at a higher speed.

BACKGROUND ART

Recently, there are widely known semiconductor memory devices such as flash memory that stores information depending on a held charge amount. A multi-value memory technology for storing two bits or more of information by setting a plurality of thresholds of the charge amount is also developed.

In the semiconductor memory devices, electric charge is discharged with passage of time, and thus, if the charge is discharged more than the threshold, an error may occur when information is read. Particularly, a multi-value type of memory device has generally narrow intervals between thresholds, and this causes the probability of occurrence of an error to increase.

Japanese Patent Application Laid-Open No. 2007-87464 discloses a storage device, using the semiconductor memory device, which includes an error correction mechanism to correctly recover incorrect information.

A BCH code or an RS (Reed-Solomon) code is often used as the error correction code used to correct errors in the error correction mechanism. In a decoding process using the BCH code or the RS code, it becomes necessary to calculate an error locator. To calculate the error locator, a Chien search method is generally used.

However, a conventional Chien search circuit processes each one bit in an area which is known to have no error. Therefore, when a code length is large, it takes a long time to perform the Chien search.

The present invention has been achieved in view of the above problems, and an object of the present invention is to provide a Chien search device and a Chien search method capable of increasing a speed of performing the Chien search process.

DISCLOSURE OF INVENTION

To solve the problems and achieve the object, a Chien search device that calculates an error position at a time of correcting an error included in data read from a nonvolatile memory according to an aspect of the present invention includes a first processing unit that performs a search process of an error position in at least one-bit unit to an error-correction area of input data; and a second processing unit that processes a plurality of bits at one time in a non-error-correction-target area of the input data.

A Chien search Method that calculates an error position at a time of correcting an error included in data read from a nonvolatile memory according to another aspect of the present invention includes performing a search process of an error position in at least one-bit unit to an error-correction area of input data; and processing a plurality of bits at one time in a non-error-correction-target area of the input data.

BRIEF DESCRIPTION OF DRAWINGS

FIG. 4-1 is an example of a first error-correction processing result in FIG. 3;

FIG. 4-2 is an example of the first error-correction processing result;

FIG. 5-1 is a configuration example of a second error-correction decoding unit;

FIG. 5-2 is a flowchart for explaining an outline of the second error-correction decoding unit;

FIG. 9-1 is a configuration diagram of a xα circuit (a circuit that multiplies by α times);

FIG. 9-2 is a configuration diagram of a xα^32 circuit (a circuit that multiplies by α^32 times);

FIG. 9-3 is a configuration diagram of a xα^111 circuit (a circuit that multiplies by α^111 times);

FIG. 9-4 is a configuration diagram of a xα^2 circuit (a circuit that multiplies by a α^2 times);

FIG. 9-5 is a configuration diagram of a xα^64 circuit (a circuit that multiplies by α^64 times);

FIG. 9-6 is a configuration diagram of a xα^222 circuit (a circuit that multiplies by α^222 times);

BEST MODE(S) FOR CARRYING OUT THE INVENTION

The present invention is explained below in detail with reference to the accompanying drawings. Note that the invention is not limited to the following embodiments. In addition, constituent elements in the embodiments include elements that readily occur to those skilled in the art or substantially equivalent elements.

Figure 1:
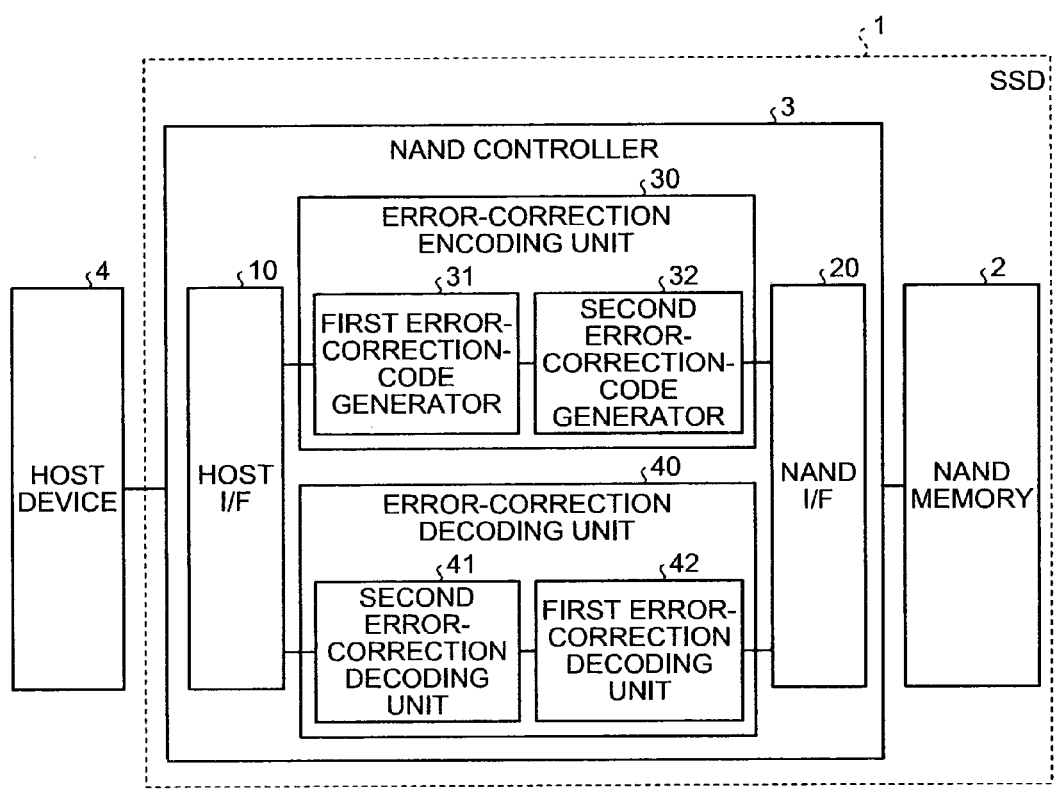
FIG. 1 is a block diagram of a configuration example of a solid state drive (SSD)

FIG. 1 is a schematic block diagram of an SSD1 according to an embodiment of the present invention. FIG. 1 is a schematic block diagram of a configuration of the SSD (Solid State Drive) 1. The SSD1 is connected to a host device (host) 4 via an I/F (interface), and functions as an external memory of the host device 4.

The SSD1 includes a NAND flash memory (hereinafter, "NAND memory") 2 as a nonvolatile memory, and a NAND controller 3 that reads and writes data to and from the NAND memory 2 corresponding to a command from the host device 4. In the present embodiment, while the NAND memory is used as a nonvolatile memory, any storage device can be provided when the nonvolatile memory stores information as nonvolatile information and can generate a change in stored data along a lapse of time.

Figure 2:
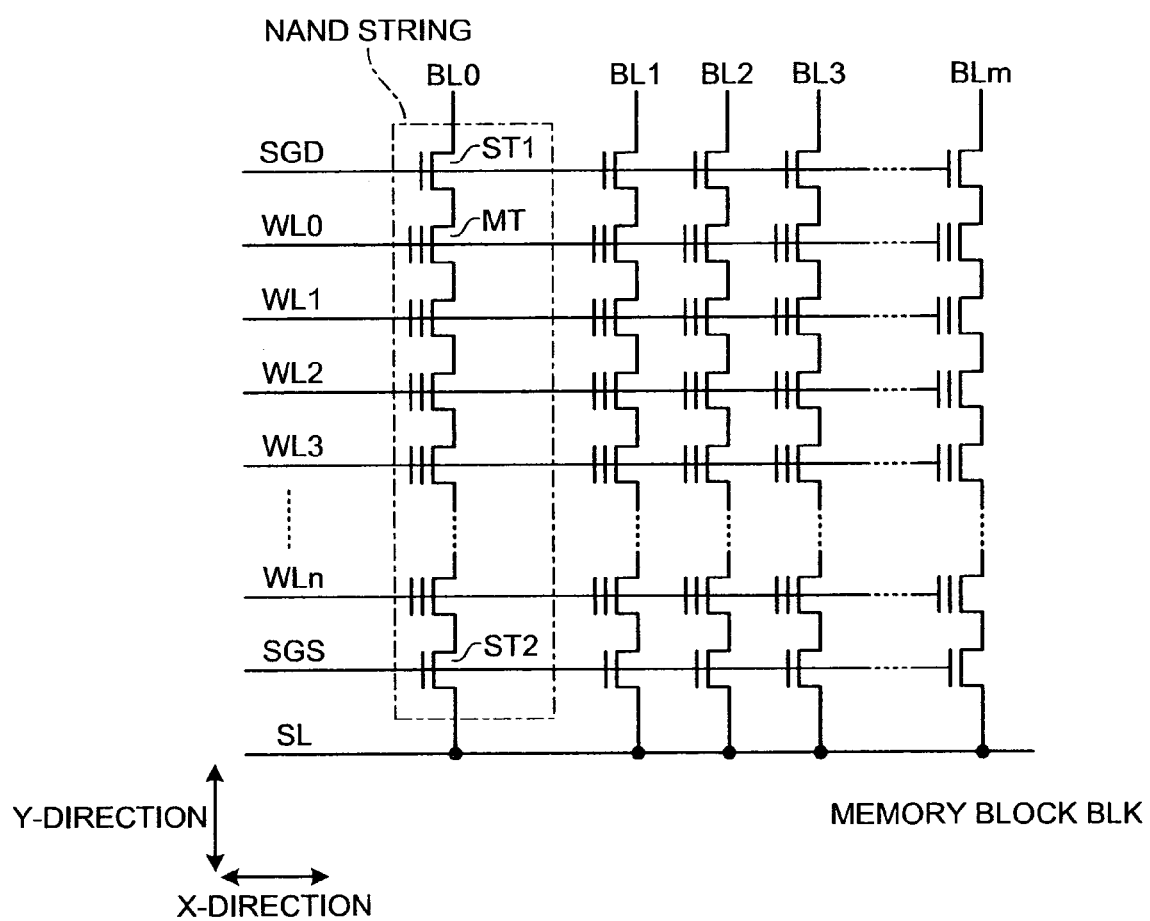
FIG. 2 is a circuit diagram of a configuration example of one block included in a NAND memory chip.

The NAND memory 2 includes plural memory blocks BLKs as a unit of data erasure. A configuration of the memory block BLK is explained with reference to FIG. 2. FIG. 2 is an equivalent circuit diagram of a configuration of any one of the memory blocks BLKs.

The memory block BLK includes m (m is an integer equal to or larger than 1) NAND strings laid out along a X-direction.

Each NAND string includes selection transistors ST1 and ST2, and n (n is an integer equal to or larger than 1) memory cell transistors MTs. The selection transistor ST1 included in each of the m NAND strings has a drain connected to bit lines BL1 to BLm, and has a gate connected in common to a selection gate line SGD. The selection transistor ST2 has a source connected in common to a source line SL, and has a gate connected in common to a selection gate line SGS.

Each memory cell transistor MT is a MOSFET (Metal oxide semiconductor field effect transistor) including a stacked gate configuration formed via a gate insulation film on a semiconductor substrate. The stacked gate configuration includes a charge accumulation layer (a floating gate electrode) formed on the gate insulation film, and a control gate electrode formed via the gate insulation film on the charge accumulation layer. In each NAND string, n memory cell transistors MTs are laid out so that respective current paths are connected in series between the source of the selection transistor ST1 and the drain of the selection transistor ST2. That is, the n memory cell transistors MTs are connected in series in a Y-direction so that adjacent memory cell transistors MTs share a source region or a drain region.

Control gate electrodes are connected to word lines WL1 to WLn respectively starting from the memory cell transistor MT positioned at the nearest side of the drain. Therefore, the drain of the memory cell transistor connected to the word line WL1 is connected to the source of the selection transistor ST1, and the source of the memory cell transistor connected to the word line WLn is connected to the drain of the selection transistor ST2.

The word lines WL1 to WLn have control gate electrodes of the memory cell transistors MTs connected in common between the NAND strings within the memory block BLK. That is, the control gate electrodes of the memory cell transistors MTs in the same row within the memory block BLK are connected to the same word line WL. Plural memory cells connected to the same word lines WLs are handled as one page, and data writing and data reading are performed for each page.

The bit lines BL1 to BLn have the drain of the selection transistor ST1 connected in common between the memory blocks BLKs. That is, the NAND strings in the same column within plural memory blocks BLKs are connected to the same bit line BL.

A threshold voltage of the memory cell transistor MT changes corresponding to a number of electrons accumulated in the floating gate electrode, and the memory cell transistor MT stores information corresponding to a difference between threshold voltages. The memory cell transistor MT can be configured to store information of one bit, or can be configured to store plural bits (multi-value) information. The embodiment of the present invention is particularly effective to a multi-value memory-cell transistor MT having a narrow distance between threshold values. A control circuit (not shown) including a sense amplifier within the NAND memory 2, and a potential-generating circuit is configured to be able to write data supplied to the NAND memory 2 into the memory cell transistor MT, and output data stored in the memory cell transistor MT to the outside.

In FIG. 1, the NAND controller 3 includes a host I/F 10 that performs an interface process with the host device 4, a NAND I/F 20 that performs an interface process with the NAND memory 2 and controls reading and writing of data, and an error-correction decoding unit 40 that performs error detection and error correction of data read from the NAND memory 2.

An error-correction encoding unit 30 includes a first error-correction-code generator 31, and a second error-correction-code generator 32. The first error-correction-code generator 31 generates a first error-correction code to perform error correction in a predetermined block BK unit to writing data. For the first error-correction code, an error correction code capable of correcting errors of one bit or plural bits can be used. In the present embodiment, the first error-correction-code generator 31 generates a six-bit hamming code (first error-correction code) having a one-bit correction capacity in a block BK unit having a 32-bit data configuration.

The second error-correction-code generator 32 generates a second error-correction code to perform error correction in a unit of plural blocks to data written into the NAND memory 2. For the second error-correction code, an error correction code capable of correcting errors of plural bits can be used. For example, a BCH code (Bosechaudhurihocquenghem code) or an RS code can be used. In the present embodiment, a BCH code of 16 bits having a correction capacity of two bits in four-block (128 bit) unit is generated.

Figure 3:
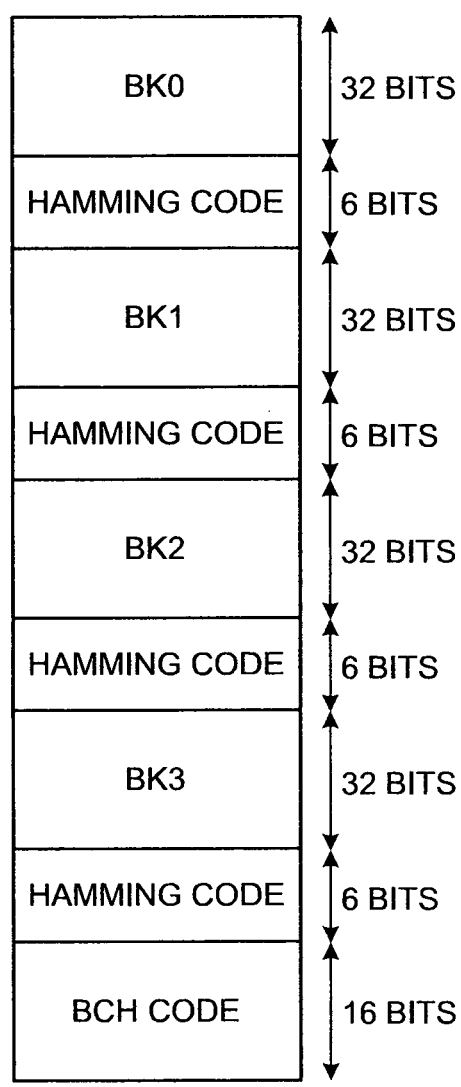
FIG. 3 is a data configuration example written into a NAND memory.

FIG. 3 is a data configuration example written into the NAND memory 2. As shown in FIG. 3, a hamming code (first error-correction code) of six bits having a correction capacity of one bit in a block BK unit having a data configuration of 32 bits is added. Further, BCH code (second error-correction code) of 16 bits having a correction capacity of two bits in a four-block BK (128 bit) unit is added.

In FIG. 1, the error-correction decoding unit 40 includes a first error-correction decoding unit 42 and a second error-correction decoding unit 41. The first error-correction decoding unit 42 performs first error correction using a hamming code in a BK unit to the data read from the NAND memory 2. The first error-correction decoding unit 42 performs error detection to the data after the first error correction, and outputs a result of the error correction to the second error-correction decoding unit 41. The second error-correction decoding unit 41 references a result of the error correction, and performs second error correction to the data after the first error correction, and performs second error correction using a BCH code in a four-block BK unit.

An outline of the operation of the SSD1 having the above configuration is explained. When the host device 4 supplies data (writing data) requested to be written into the SSD1, the host I/F 10 supplies the received writing data to the error-correction encoding unit 30. The error-correction encoding unit 30 generates first and second error-correction codes to the writing data. The NAND I/F 20 writes the writing data added with the first and second error-correction codes into the NAND memory 2.

When a data reading request is input from the host device 4, the NAND I/F 20 reads the read-requested data (reading data and the first and second error-correction codes added to this data, and supplies the read result to the error-correction decoding unit 40. The error-correction decoding unit 40 performs the first and second error corrections to the reading data. The host I/F 10 transfers the error-corrected data to the host device 4.

[Second Error Correcting Unit]

Figures 1, 2, 4:
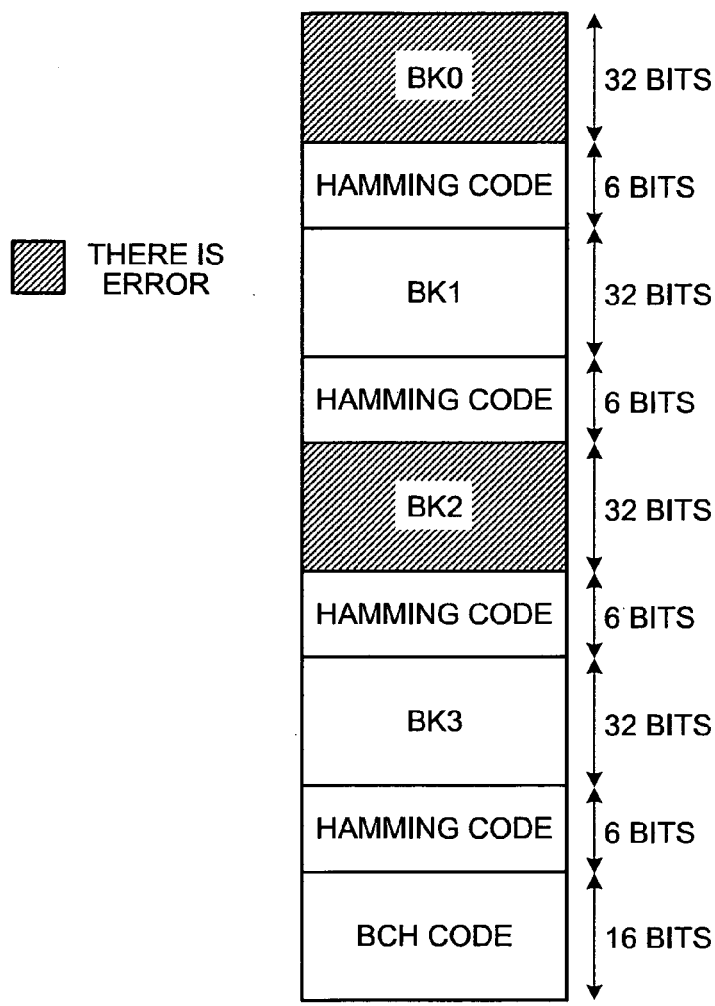
Figures 1, 5:
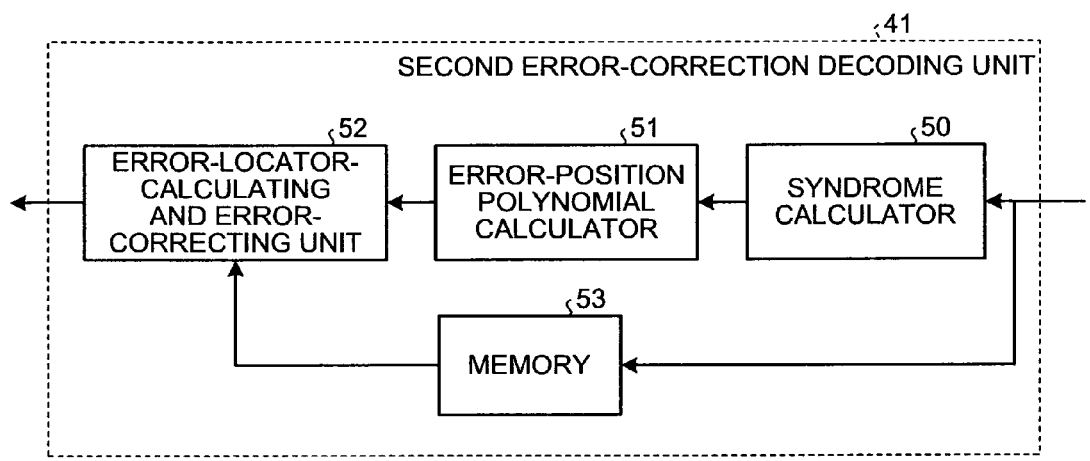
Figures 2, 5:
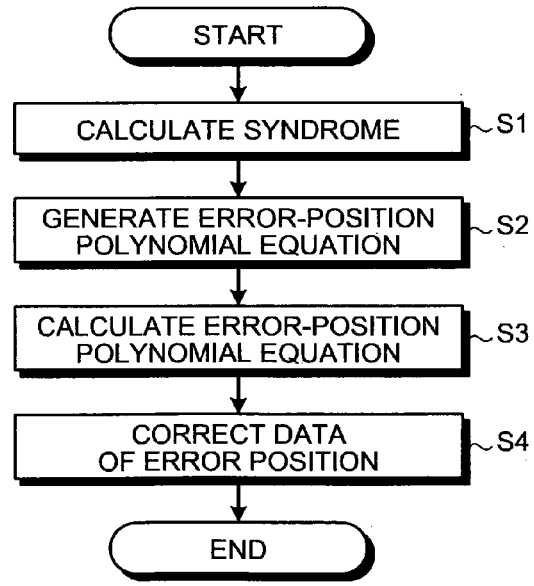
Figure 6:
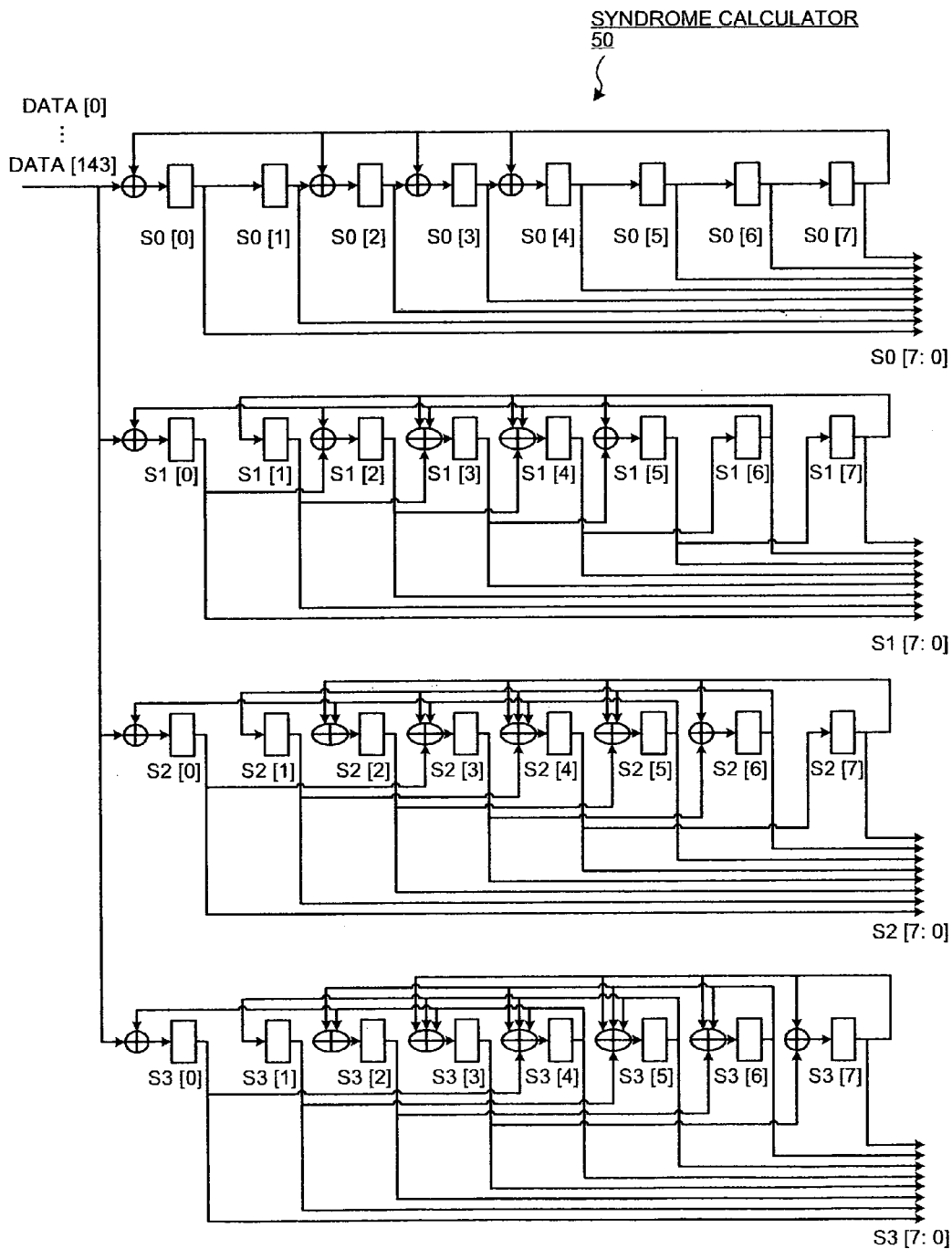
FIG. 6 is a circuit configuration example of a syndrome calculator.

A configuration and operation of the second error-correction decoding unit 41 shown in FIG. 1 are explained in detail with reference to FIG. 4 to FIG. 11. FIG. 4-1 is a data configuration example after first error correction, and FIG. 4-2 is an example of a result of the first error-correction process. FIG. 5-1 is a configuration example of the second error-correction decoding unit 41. FIG. 5-2 is a flowchart for explaining an outline of the second error-correction decoding unit. FIG. 6 is a circuit configuration example of a syndrome calculator.

In the present embodiment, the Chien search circuit of the second error-correction decoding unit 41 includes a second processing unit that performs a passing process (skipping process) in one cycle (at one time) a predetermined bit-width component in other areas than an error-correction area, in addition to a first processing unit that performs a search process of an error position in one-bit unit in an error-correction area. With this arrangement, the Chien search circuit performs the Chien search at a high speed.

As shown in FIG. 5-1, the second error-correction decoding unit 41 includes a syndrome calculator 50 that calculates a syndrome value of reading data of which first error correction is finished, an error-position polynomial calculator 51 that generates an error-position polynomial equation based on the syndrome value, an error-locator-calculating and error-correcting unit 52 that specifies an error position by calculating a root of the error-position polynomial equation, and corrects data of the error position, and a memory 53 that temporarily stores data.

As shown in FIG. 5-2, in the second error-correction decoding unit 41, the syndrome calculator 50 first calculates a syndrome value of reading data of which first error correction is finished (Step S1). The error-position polynomial calculator 51 generates an error-position polynomial equation based on the syndrome value (Step S2). The error-locator-calculating and error-correcting unit 52 calculates a root of the error-position polynomial equation (Step S3), and corrects data of the error position (Step S4).

The error-correction decoding operations performed by the first error-correction decoding unit 42 and the second error-correction decoding unit 41 are explained in detail below. When the host device 4 requests to read data from the NAND memory 2, the NAND I/F 20 reads the requested data from the NAND memory 2, and outputs the read data to the first error-correction decoding unit 42.

Data (data block, hamming code, BCH code) read from the NAND memory 2 are input to the first error-correction decoding unit 42. The first error-correction decoding unit 42 performs first error correction using the hamming code for each block BK. In the present embodiment, the hamming code has a one-bit error correction capacity. Therefore, two or more bits cannot be corrected. The first error-correction decoding unit 42 detects whether the error correction of the block BK was able to be done by the first error-correction process. Specifically, for example, a syndrome calculation is performed for the block BK after the first error correction. It can be determined whether the error correction was able to be performed, based on a result of the calculation ("0"=no error). Alternatively, an error detection code is added to each block BK, and it can be checked whether there is an error in the data after the first error correction using the error detection code.

The first error-correction decoding unit 42 abandons the hamming code, and outputs the block BK after the first error-correction process, the BCH code, and a result of the first error-correction process of each block BK (a result of the first error-correction decoding) to the second error-correction decoding unit 41. It is explained below that, as shown in FIG. 4-1, there are errors in BK0 and BK2 out of the read data after the first error correction. FIG. 4-2 depicts a result (one bit) of the first error-correction process in FIG. 4-1. In FIG. 4-2, "0" represents that there is no error, and "1" represents that there is an error.

In the second error-correction decoding unit 41, the block BK after the first error-correction process, the BCH code, and the result of the first error correction of each block BK (one bit) are stored in the memory 53. At the same time, the block BK after the first error-correction process and the BCH code are input to the syndrome calculator 50. In the following explanations, when the second error-correction-code generator 32 performs the BCH encoding, a primitive polynomial equation G(X) is used. The primitive polynomial equation $$G(X)=x^8+x^4+x^3+x^2+1 \quad (1)$$

As shown in FIG. 6, in the syndrome calculator 50, BK0, 1, 2, 3 and data [0] to data [143] of the BCH code are input by each one bit in this order. The syndrome calculator 50 performs syndrome calculation, and outputs syndrome calculation results S0 [7:0] to S3 [7:0] to the error-position polynomial calculator 51.

In FIG. 5-1, the error-position polynomial calculator 51 calculates coefficients σ1 and σ2 of an error-position polynomial equation σ(Z)=1+σ0Z+σ1Z^2, using the syndrome calculation results S0 [7:0] to S3 [7:0]. This is explained using the Peterson's algorithm. The Berlekamp-Massey (BM) algorithm and the Euclidean algorithm can be also used. According to the Peterson's algorithm, a matrix of the following equation (2) is calculated using the syndrome calculation values S0 to S3, to obtain the coefficients σ1 and σ1 of the error-position polynomial equation. Coefficients σ0 [7:0] and σ1 [7:0] of the error-position polynomial equation calculated by the error-position polynomial calculator 51 are output to the error-locator-calculating and error-correcting unit 52.

$$\begin{pmatrix} S1 & S0 \\ S2 & S1 \end{pmatrix} \begin{pmatrix} \sigma 0 \\ \sigma 1 \end{pmatrix} = -\begin{pmatrix} S2 \\ S3 \end{pmatrix} \quad (2)$$

The error-locator-calculating and error-correcting unit 52 specifies an error position by performing a Chien search based on the coefficients σ0 [7:0] and σ1 [7:0] of the error-position polynomial equation received from the error-position polynomial calculator 51, and performs second error correction to the data of which the first error correction is finished.

Figure 7:
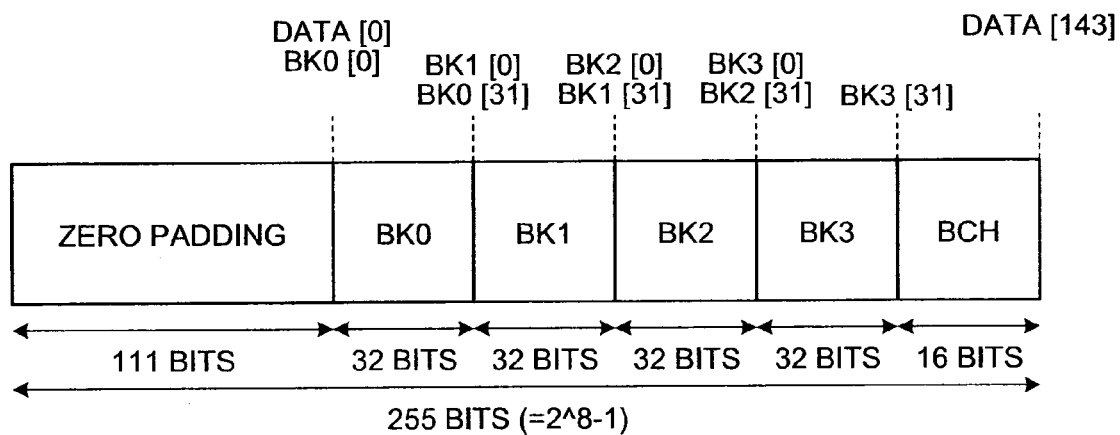
FIG. 7 is a configuration diagram of data of a second error-correction process.

As shown in FIG. 7, the error-locator-calculating and error-correcting unit 52 processes header 111 bits by zero padding to the data to be processed, to set a code length to $2^N-1$ (where N=8)=255 bits (fixed length)).

Figure 8:
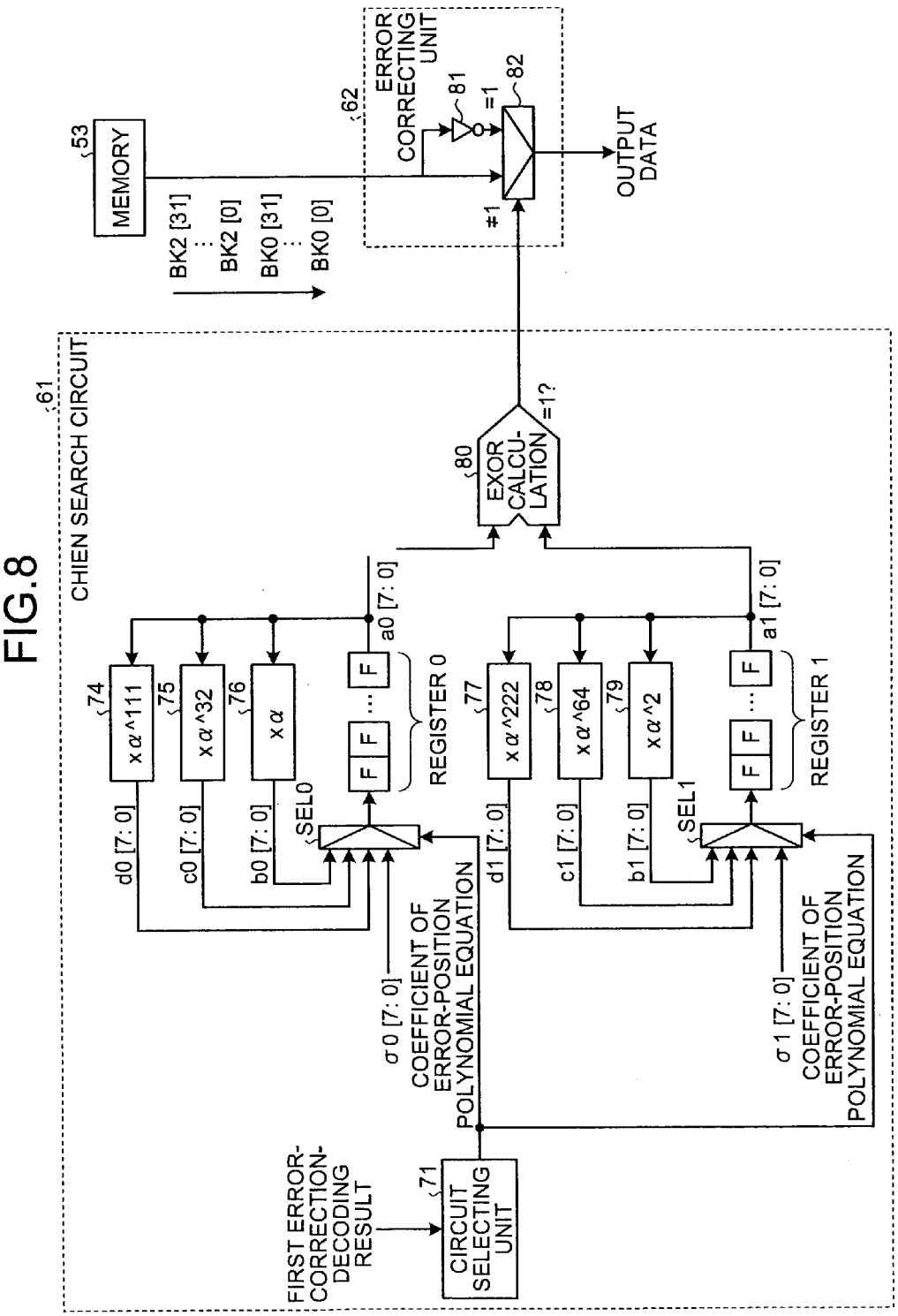
FIG. 8 is a configuration example of a Chien search circuit and an error correcting unit of an error-locator-calculating and error-correcting unit.
Figure 10:
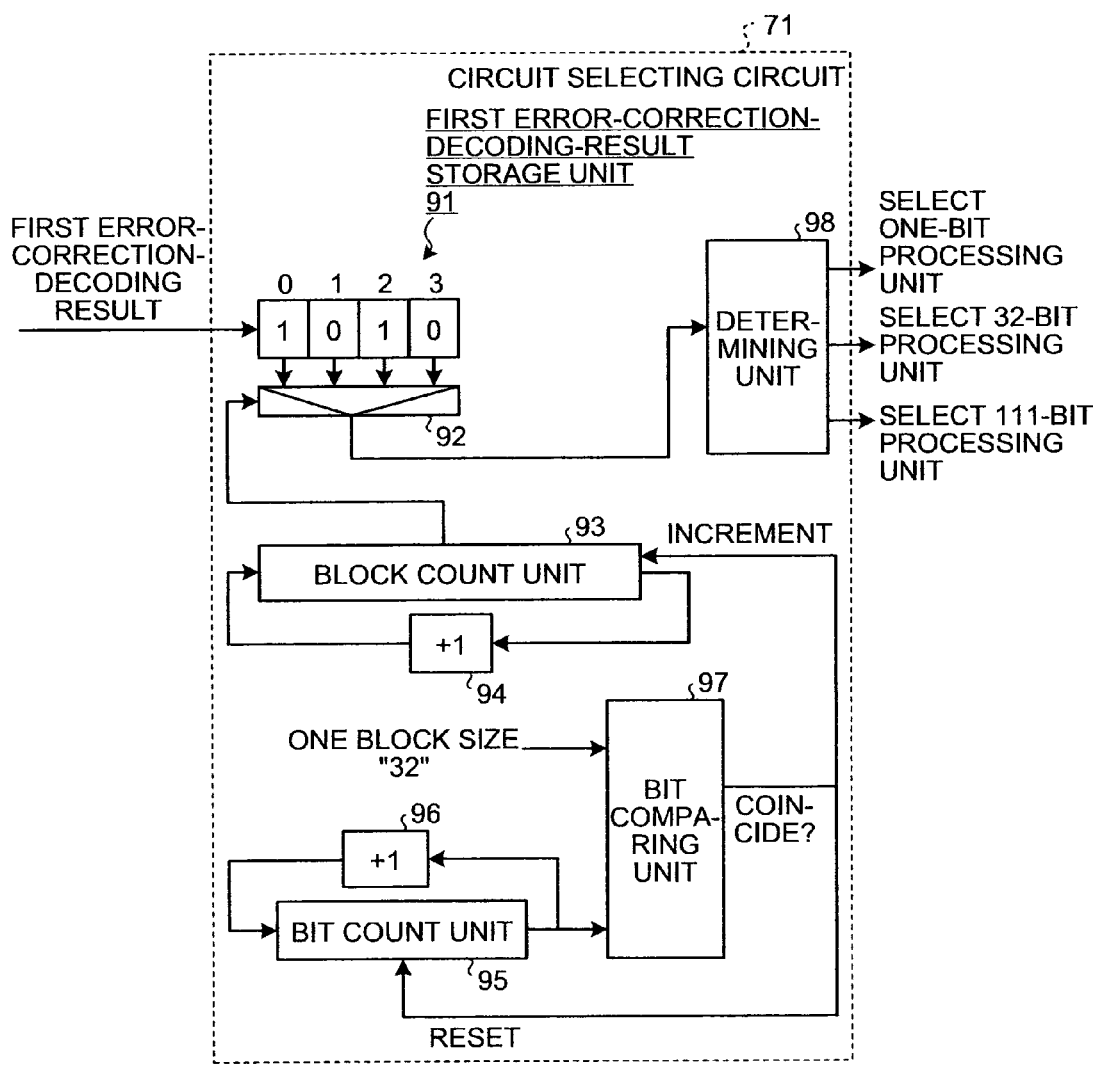
FIG. 10 is a configuration example of a circuit selecting unit.

FIG. 8 is a configuration example of a Chien search circuit 61 and an error correcting unit 62 of the error-locator-calculating and error-correcting unit 52. FIG. 9-1 is a configuration diagram of a xα circuit (a circuit that multiplies by α times (a multiplier circuit)) of the Chien search circuit 61. FIG. 9-2 is a configuration diagram of a xα^32 circuit (a circuit that multiplies by α^32 times) of the Chien search circuit 61. FIG. 9-3 is a configuration diagram of a xα^111 circuit (a circuit that multiplies by α^111 times) of the Chien search circuit 61. FIG. 9-4 is a configuration diagram of a xα^2 circuit (a circuit that multiplies by α^2 times) of the Chien search circuit 61. FIG. 9-5 is a configuration diagram of a xα^64 circuit (a circuit that multiplies by α^64 times) of the Chien search circuit 61. FIG. 9-6 is a configuration diagram of a xα^222 circuit (a circuit that multiplies by α^222 times) of the Chien search circuit 61. FIG. 10 is a configuration example of a circuit selecting unit of the Chien search circuit.

The Chien search algorithm is a method of checking whether σ(αi) is zero, by sequentially substituting a power αi (i=0, 1, . . . , n−1) of the algorithm α into σ(z). The search of a root according to this method is called the Chien search.

As shown in FIG. 8, the Chien search circuit 61 includes a circuit selecting unit 71 that outputs a changeover signal to selectors SEL0 and SEL1, the selector SEL0 that selectively outputs an output of a xα circuit 76, a xα^32 circuit 75, and a xα^111 circuit 74, the selector SEL1 that selectively outputs an output of a xα^2 circuit 79, a xα^64 circuit 78, and a xα^222 circuit 77, registers 0 and 1, and an EXOR calculating unit 80.

The Chien search circuit 61 includes a one-bit processing unit (the xα circuit 76, the xα^2 circuit 79), a 32-bit processing unit (the xα^32 circuit 75, the xα^64 circuit 78), and a 111-bit processing unit (the xα^111 circuit 74, the xα^222 circuit 77).

In the Chien search circuit 61 according to the present embodiment, the 32-bit processing unit (the xα^32 circuit 75, the xα^64 circuit 78), and the 111-bit processing unit (the xα^111 circuit 74, the xα^222 circuit 77) are provided in addition to the one-bit processing unit (the xα circuit 76, the xα^2 circuit 79). With this arrangement, a speed of the Chien search is increased.

The one-bit processing unit (the xα circuit 76, the xα^2 circuit 79) is used to process in one-bit unit a block in the error-correction area. The 32-bit processing unit (the xα^32 circuit 75, the xα^64 circuit 78) is used to process a block (32 bits) in which it is determined that no error is detected in a non-error-correction-target area. The 32-bit processing unit can process 32-bit data in one cycle (one degree). The 111-bit processing unit (the xα^111 circuit 74, the xα^222 circuit 77) is used to process a padding area (111 bits) that is padded by zero in the non-error-correction-target area. The 111-bit processing unit can process 111-bit data in one cycle (one degree).

The error correcting circuit 62 includes an inverter 81 that outputs data in inversion, and a selector 82 that outputs an inverted value of input data when a result of the EXOR calculation performed by the EXOR calculating unit 80 is "1", and outputs the input data straight when a result of the EXOR calculation is other than "1".

A flow of the process performed by the Chien search circuit 61 is explained. First, the Chien search circuit 61 takes in the coefficients σ0 [7:0] and σ1 [7:0] calculated by the error-position polynomial equation calculation.

(1) First, the process proceeds to the process of the header zero padding area. Because it is clear that there is no error in this area, the circuit selecting unit 71 outputs a selection signal to select the xα^111 circuit 74 and the xα^222 circuit 77, to the selectors SEL0 and SEL1. The selectors SEL0 and SEL1 select an output (d0 [7:0]) of the xα^111 circuit 74 and an output (d1 [7:0]) of the xα^222 circuit 77 respectively, and take the outputs into the register 0 and the register 1. With this arrangement, the process of the zero padding area (111 bits) can be performed in one cycle (at one time), and the zero padding area (111 bits) can be processed at a high speed.

(2) The Chien search circuit 61 processes the block BK0. The block BK0 is an error-correction block BK. The error correcting unit 62 takes out the header data BK0 [0] of the block BK0 from the memory 53. Next, the selectors SEL0 and SEL1 select an output (b0 [7:0]) of the xα circuit 76, and an output (b1 [7:0]) of the xα^2 circuit 79, and take the outputs into the register 0 and the register 1. When a result of the EXOR calculation performed by the EXOR calculating unit 80 of the register 0 and the register 1 is "1", a selector 92 of the error correcting unit 62 outputs an inverted value of the BK0 [0]. When a result of the EXOR calculation is other than "1", the selector 92 of the error correcting unit 62 outputs the value of BK0 [0] straight. The error correcting unit 62 takes out second data BK0 [1] of the block BK0 from the memory 53. The error correcting unit 62 selects the output (b0 [7:0]) of the xα circuit 76, and the output (b1 [7:0]) of the xα^2 circuit 79, and takes the outputs into the register 0 and the register 1. When a result of the EXOR calculation performed by the EXOR calculating unit 80 of the register 0 and the register 1 is "1", the selector 92 of the error correcting unit 62 outputs an inverted value of the BK0 [1]. When a result of the EXOR calculation is other than "1", the selector 92 of the error correcting unit 62 outputs the value of BK0 [1] straight. This operation is repeated to the last data BK0 [31] of the block BK0 in a similar manner. In this way, BK0 is processed in one-bit unit.

(3) The Chien search circuit 61 processes the block BK1. Because the block BK1 is a non-error-correction-target block, an output (c0 [7:0]) of the xα^32 circuit 75 and an output (c1 [7:0]) of the xα^64 circuit 78 are taken into the register 0 and the register 1. As a result, the non-error-correction-target block (32 bits) can be processed at once, and a speed of processing the non-error-correction-target block (32 bits) can be increased.

(4) The Chien search circuit 61 processes the block BK2. The block BK2 is an error-correction block. The header data from BK2 [0] to the last data BK2 [31] of the block BK2 are taken out from the memory 53, and are processed, in a similar manner to that in (3).

(5) The Chien search circuit 61 processes the block BK3. Because the block B3 is a non-error-correction-target block, the output (c0 [7:0]) of the xα^32 circuit 75 and the output (c1 [7:0]) of the xα^64 circuit 78 are taken into the register 0 and the register 1.

While the error-correction block is processed in one-bit unit in the above embodiment, the error-correction blocks of two or more bits can be processed in parallel, and the non-error-correction-target area can be processed in one cycle. For example, in the case of a parallel process of two bits, providing the Chien search circuit 61 and the error correcting unit 62 for odd number bits as well as for even number bits is sufficient. Further, in the case of a parallel process of three bits, providing three pairs of the Chien search circuit 61 and the error correcting unit 62 is sufficient.

FIG. 10 is a configuration example of the circuit selecting unit 71. The circuit selecting unit 71 includes a first error-correction-decoding-result storage unit 91, the selector 92, a block counter unit 93, a bit counter unit 95, a bit comparing unit 97, and a determining unit 98.

The first error-correction-decoding-result storage unit 91 stores a result of first error-correction decoding of each of the blocks BK0 to BK3. "0" represents a BK that can be corrected (second non-error-correction-target-decoding block). "1" represents a BK that cannot be corrected (second error-correction-decoding block).

The bit counter unit 95 counts a bit counter value as a current processing position in one block BK, and outputs a count result to the bit comparing unit 97 (bit counter value=0 to 31). The block counter unit 93 counts a block counter value as a current processing block in four blocks BKs, and outputs a count result to the selector 92 (block counter value=0 to 3). The bit comparing unit 97 determines whether a bit counter value is equal to a block size. When a bit counter value is equal to a block size, the bit comparing unit 97 causes the block counter unit 93 to increment the block counter value.

The selector 92 outputs a first error-correction-decoding result stored in the first error-correction-decoding-result storage unit 91 of the block indicated by the block counter value to the determining unit 98. The determining unit 98 selects one of the one-bit processing unit (the xα circuit 76, the xα^2 circuit 79), the 32-bit processing unit (the xα^32 circuit 75, the xα^64 circuit 78), and the 111-bit processing unit (the xα^111 circuit 74, the xα^222 circuit 77), and outputs a selection signal to the selectors SEL0 and SEL1. Immediately after starting the process, the determining unit 98 selects the 111-bit processing unit (the xα^111 circuit 74, the xα^222 circuit 77) to process the padding area. When the current processing block is the non-error-correction-target block, the determining unit 98 selects the 32-bit processing unit (the xα^32 circuit 75, the xα^64 circuit 78). When the current processing block is the error-correction block, the determining unit 98 selects the one-bit processing unit (the xα circuit 76, the xα^2 circuit 79).

Figure 11:
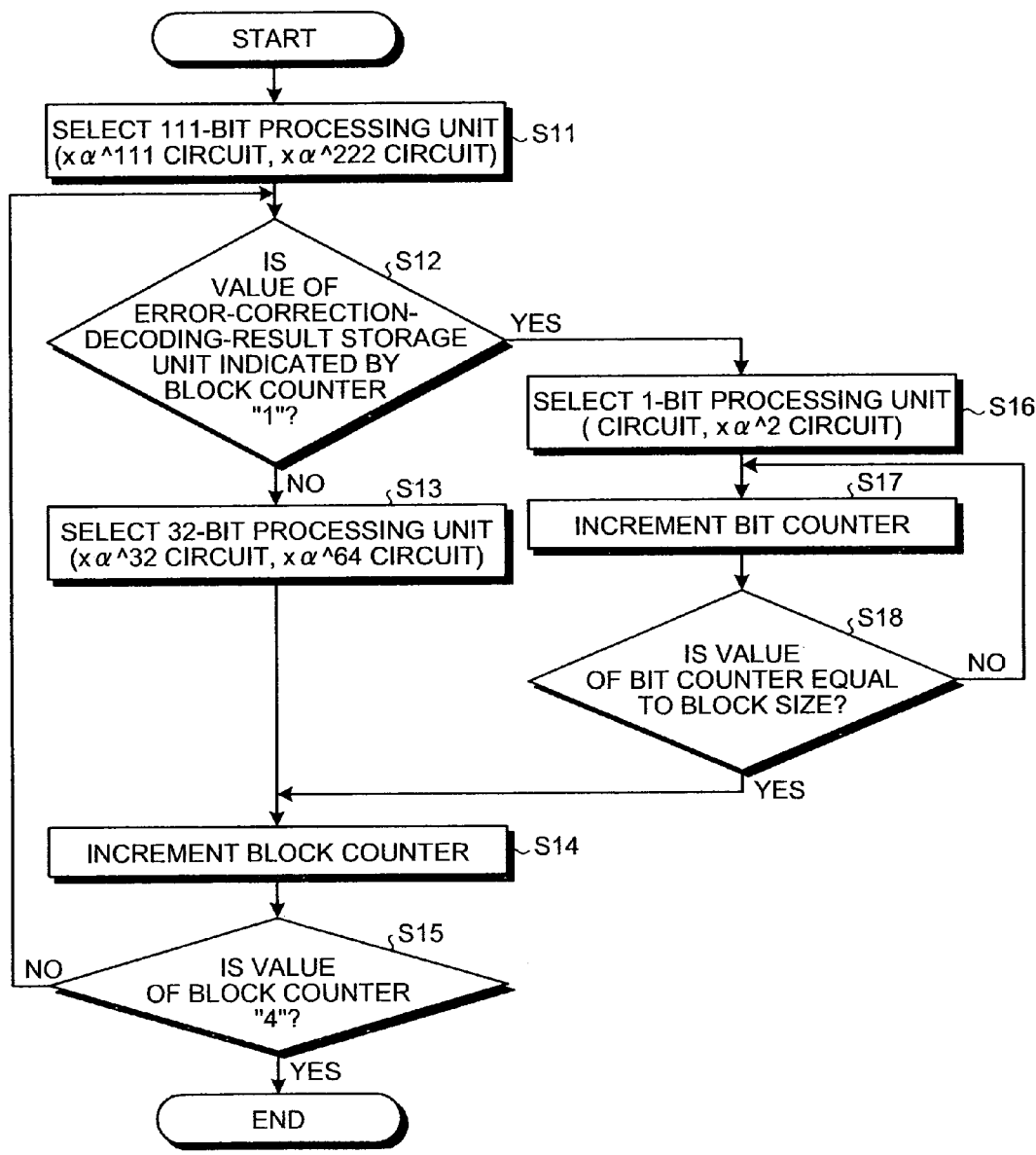
FIG. 11 is a flowchart for explaining an operation of the circuit selecting unit.

FIG. 11 is a flowchart for explaining the operation of the circuit selecting unit 71. In FIG. 11, the determining unit 98 first selects the 111-bit processing unit (the xα^111 circuit 74, the xα^222 circuit 77) (Step S11). Next, the determining unit 98 determines whether a value of the first error-correction-decoding-result storage unit 91 indicated by the block counter value is "1" (Step S12). When a value of the first error-correction-decoding-result storage unit 91 indicated by the block counter value is "1" (YES at Step S12), the determining unit 98 determines the one-bit processing unit (the xα circuit 76, the xα^2 circuit 79) (Step S16). The bit count unit 95 increments the bit counter value (Step S17), and the bit comparing unit 97 determines whether a bit counter value is equal to a block size "32" (Step S18). When a bit counter value is equal to a block size (YES at Step S18), the process proceeds to Step S14. On the other hand, when a bit counter value is not equal to a block size (NO at Step S18), the process returns to Step S17.

When a value of the first error-correction-decoding-result storage unit 91 indicated by the block counter value is not "1" at Step S12 (NO at Step S12), the determining unit 98 selects the 32-bit processing unit (the xα^32 circuit 75, the xα^64 circuit 78) (Step S13). The block count unit 95 increments the block counter (Step S14). When the block counter value is "4" (YES at Step S15), the flow is finished. On the other hand, when the block counter value is not "4" (NO at Step S15), the process returns to Step S12.

As explained above, according to the present embodiment, in addition to the processing unit that performs a search process of the error position in one-bit unit in the error-correction area, the Chien search circuit 61 includes the processing unit that processes in one cycle (at one time) plural bits in the non-error-correction-target area. Therefore, the Chien search can be performed at a high speed.

The Chien search circuit 61 processes in one cycle (at one time) the non-error-correction-target block which is determined to have no error by the error detection, by the 32-bit processing unit (the xα^32 circuit 75, the xα^64 circuit 78). Therefore, the processing time required for the block which is determined to have no error by the error detection can be decreased, and the Chien search can be performed at a high speed.

In the Chien search circuit 61, the 111-bit processing unit (the xα^111 circuit 74, the xα^222 circuit 77) processes in one cycle (at one time) the data in the padding area. Therefore, the processing time required for the padding area can be decreased, and the Chien search can be performed at a high speed.

In the above embodiment, a size of the block is set as 32 bits. The BCH code has a 16-bit size having two-bit correction capacity. The padding area has 111 bits. However, in the present invention, sizes are not limited to the above. A size of the block, correction capacity and a size of the BCH code, and a size of the padding area can take any values. While the BCH code is explained as an example for the encoding system that performs a Chien search, the code is not limited to this in the present invention. Other encoding system using a Chien search such as the RS code can be also used.

In the above embodiment, while the present invention is applied to the SSD having a NAND memory, the present invention can be also applied to the SSD having other flash EEPROM such as a NOR type.

In each embodiment of the present invention, each functional block can be achieved as one of hardware and computer software or a combination of both. Therefore, each block is explained as follows to identify any one of hardware, computer softer or both, from the viewpoint of these functions. Whether these functions are achieved as hardware or software depends on a design constraint applied to a detailed embodiment or the entire system. Those skilled in the art can achieve these functions in various ways for each specific embodiment, and determining such achievement is also included in the scope of the present invention.

According to the present invention, a Chien search device and a Chien search method capable of performing the Chien process at a high speed can be provided.

The invention claimed is:

1. A storage device comprising:
   a nonvolatile memory; and
   an error correction circuit that corrects an error included in first data read from the nonvolatile semiconductor memory with error-correcting code associated with the first data, the error correction circuit comprising:
   a first error correction unit that performs a first error correction process to the first data, and then performs an error detection process to the first data and outputs an error detection result;
   a second error correction unit that includes a chien search circuit for calculating an error position in the first data output from the first error correction unit, the chien search circuit comprising:
      a determination unit that determines an error-correction area and a non-error-correction area of the first data based on error detection result from the first error correction unit;
      a first processing unit that performs an error position search process to an error-correction area of the first data at least one-bit unit at one time;
      a second processing unit that performs a passing or skipping process to a non-error-correction area of the first data a first plurality of bits at one time.

2. The storage device according to claim 1, wherein
   the second error correction unit adds padding area to the first data, and
   the determination unit further determines a padding area of the padding-area-added first data, and the chien search circuit further comprising a third processing unit that performs a passing or skipping process to the padding area of the padding-area-added first data a second plurality of bits at one time.

3. The storage device according to claim 1, wherein
   the error-correcting code includes a first error-correcting and a second error-correcting code,
   the first error-correcting code is generated for a first unit of the first data, and the second error-correcting code is generated for a plurality of the first unit of the first data, and the first error correction unit performs the first error correction process to each first unit of first data by using the first error-correcting code.

4. The storage device according to claim 3, wherein the determination unit determines an error-correction area and non-error-correction area of the first data for each first unit of the first data.

5. The storage device according to claim 4, wherein the first error-correcting code is Hamming code and the second error-correcting code is BCH code.

6. An error correction circuit that correct an error included in input data with error-correcting code associated with the input data, comprising:
- a first error correction unit that performs a first error correction process to the input data, and then performs an error detection process to the input data and output an error detection result; and
- a second error correction unit that includes a chien search circuit for calculating an error position in the input data output from the first error correction unit, the chien search circuit comprising:
  - a determination unit that determines an error-correction area and a non-error-correction area of the input data based on error detection result from the first error correction unit;
  - a first processing unit that performs an error position search process to an error-correction area of the input data at least one-bit unit at one time; and
  - a second processing unit that performs a passing or skipping process to a non-error-correction area of the input data a first plurality of bits at one time.

7. The error correction circuit according to claim 6, wherein
- the second error correction unit adds padding area to the input data, and
- the determination unit further determines a padding area of the padding-area-added input data, and the chien search circuit further comprising a third processing unit that performs a passing or skipping process to the padding area of the padding-area-added input data a second plurality of bits at one time.

8. The error correction circuit according to claim 6, wherein
- the error-correcting code includes a first error-correcting code and a second error-correcting code, the first error-correcting code is generated for a first unit of the input data,
- the second error-correcting code is generated for a plurality of the first unit of the input data, and
- the first error correction unit performs the first error correction process to each first unit of input data by using the first error-correcting code.

9. The error correction circuit according to claim 8, wherein the determination unit determines an error-correction area and non-error-correction area of the input data for each first unit of the input data.

10. The error correction circuit according to claim 9, wherein the first error-correcting code is Hamming code and the second error-correcting code is BCH code.

11. A error correction method that correct an error included in input data with error-correcting code associated with the input data, the error correction method comprising:
- performing a first error correction process to the input data, and then performing an error detection process to the input data and calculating an error detection result;
- determining an error-correction area and a non-error-correction area of the input data based on error detection result;
- performing an error position search process to an error-correction area of the input data at least one-bit unit at one time; and
- performing a passing or skipping process to a non-error-correction area of the input data a first plurality of bits at one time.

12. The method according to claim 11, further comprising:
- adding padding area to the input data before determining an error-correction area and a non-error-correction area of the input data;
- determining an padding area of the padding-area-added input data; and
- performing a passing or skipping process to the padding area of the padding-area-added input data a second plurality of bits at one time.

13. The method according to claim 11, wherein
- the error-correcting code includes a first error-correcting code and a second error-correcting code, the first error-correcting code is generated for a first unit of the input data,
- the second error-correcting code is generated for a plurality of the first unit of the input data, and
- the first error correction process is performed to each first unit of input data by using the first error-correcting code.

14. The method according to claim 13, wherein the determining an error-correction area and a non-error-correction area of the input data is performed for each first unit of the input data.

15. The method according to claim 14, wherein the first error-correcting code is Hamming code and the second error-correcting code is BCH code.

* * * * *